United States Patent
Olsen

(10) Patent No.: US 8,017,447 B1
(45) Date of Patent: Sep. 13, 2011

(54) LASER PROCESS FOR SIDE PLATING OF TERMINALS

(75) Inventor: Edward William Olsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/849,331

(22) Filed: Aug. 3, 2010

(51) Int. Cl.
*H01L 21/44* (2006.01)

(52) U.S. Cl. .......... 438/123; 438/15; 438/112; 438/121; 257/E23.037

(58) Field of Classification Search .................... 438/15, 438/112, 121, 123
See application file for complete search history.

(56) References Cited

U.S. PATENT DOCUMENTS

| | | | |
|---|---|---|---|
| 6,608,366 B1 | 8/2003 | Fogelson | |
| 7,008,825 B1 * | 3/2006 | Bancod et al. | 438/123 |
| 7,144,517 B1 * | 12/2006 | Yang et al. | 216/13 |
| 7,183,630 B1 * | 2/2007 | Fogelson et al. | 257/666 |
| 7,781,299 B2 * | 8/2010 | Koh | 438/401 |
| 7,816,186 B2 * | 10/2010 | San Antonio et al. | 438/123 |
| 2010/0001291 A1 * | 1/2010 | Otremba et al. | 257/77 |
| 2010/0109135 A1 * | 5/2010 | Jereza | 257/676 |
| 2010/0127375 A1 * | 5/2010 | Galera et al. | 257/690 |
| 2010/0311208 A1 * | 12/2010 | Sirinorakul et al. | 438/113 |
| 2011/0023293 A1 * | 2/2011 | Bayan et al. | 29/739 |

\* cited by examiner

*Primary Examiner* — Alexander Ghyka
(74) *Attorney, Agent, or Firm* — McDermott Will & Emery LLP

(57) ABSTRACT

A method of preparing a portion of the side of a terminal of an Integrated Circuit (IC) package for solder is disclosed. The method comprises the steps of attaching an IC die to a leadframe comprising a connecting bar, reducing the thickness of a portion of the connecting bar, overmolding the leadframe with a mold compound, removing the mold compound from the reduced-thickness portion of the connecting bar using a laser, coating the reduced-thickness portion of the connecting bar with a solder-wettable material, and cutting through the thickness of the connecting bar within the reduced thickness portion of the connecting bar, wherein the cut has a width that is less than the width of the reduced thickness portion of the connecting bar.

18 Claims, 5 Drawing Sheets

LASER PROCESS FOR SIDE PLATING OF TERMINALS

BACKGROUND

1. Field

The present disclosure generally relates to integrated circuit (IC) packages and, more particularly, to methods of plating and singulating IC packages.

2. Description of the Related Art

The silicon chips on which integrated circuits are formed are so small that they are sensitive to damage and hard to handle, and many IC chips are packaged in enclosures that protect the chips and provide larger contact leads that can be attached to circuitry on substrates such as printed circuit boards (PCBs). One common method of assembling an IC package of this type is to attach a "leadframe" as a mechanical support to the die during its assembly. A portion of the leadframe is trimmed off, leaving only the leads that provide the external connections for the finished product. A leadframe comprises a "die attach pad", to which the die is attached, and "leads", which provide external electrical connections. The die, adhesive, wires and leadframe are encased in a housing that may be a molded plastic part or an overmold of a mold compound, wherein the terminal are exposed on the exterior surface of the housing.

In certain configurations of IC packages, such as a Dual Flat No-lead (DFN) or Quad Flat No-lead (QFN) package, the terminals are exposed on the underside of the IC package. FIGS. 1A and 1B depict a typical IC package having terminals that do not protrude from the housing but, rather, are exposed on the underside and side of the IC package, wherein FIG. 1A is a view of the top and FIG. 1B is a view of the bottom of the same IC package. This configuration of IC package is compact and minimizes the area required to mount the IC package on a PCB. One difficulty with this type of package is that it is not possible to visually inspect the solder joint between the terminals and the contact pads of the PCB. Inspection of the solder joints of this type of IC package must be performed using X-ray images.

It has been found that the creation of a notch at the outside lower corner of the terminal produces a solder fillet when a good solder joint has been created. It is possible to inspect this solder fillet in place of X-raying the solder joint to verify that a good solder joint has been formed. Elimination of the X-ray inspection may reduce the cost and complexity of the product line as well as increasing the production rate. Creation of a notch by saw cutting is disclosed in U.S. Pat. No. 6,608,366 to Fogelson et al. The disclosed process requires a first half-thickness saw cut to create a notch, and a second thinner saw cut to singulate the IC packages. Saw blades are a significant expense in the manufacturing of IC packages and the need to perform the half-thickness saw cut prior to singulation adds cost to the manufacturing process.

SUMMARY

There is a need for a lower-cost method of creating a notch in the connecting bars of a leadframe during the IC package manufacturing process. Use of a laser to remove mold compound from an etched groove eliminates the need for a half-depth saw cut after the IC packages have been overmolded and may produce a overall saving in the manufacturing process.

In certain embodiments, a method of plating a portion of the side of a terminal of an Integrated Circuit (IC) package is disclosed. The method comprises the steps of attaching an IC die to a leadframe comprising a connecting bar having a thickness, reducing the thickness of a portion of the connecting bar, the reduced-thickness portion having a width, overmolding the leadframe with a mold compound, removing the mold compound from the reduced-thickness portion of the connecting bar using a laser, coating the reduced-thickness portion of the connecting bar with a solder-wettable material, and cutting through the thickness of the connecting bar within the reduced thickness portion of the connecting bar, wherein the cut has a width that is less than the width of the reduced thickness portion of the connecting bar.

In certain embodiments, a method of creating a solder terminal that can be visually inspected is disclosed. The method comprises the steps of etching a connecting bar of a leadframe, wherein the connecting bar has an underside and the etching removes material from the underside over a portion of the connecting bar, the etched portion having a surface with a width, lasering the etched portion of the connecting bar with sufficient energy and duration to remove material on the surface of the etched portion, coating the etched portion of the connecting bar with a solder-wettable material, and cutting through the etched portion of the connecting bar, wherein the cut has a width that is less than the width of the etched portion.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The methods disclosed herein describe how an IC package terminal may be beveled to create a visually inspectable solder joint when the IC package is soldered to a PCB. The process etches the connection bars in a frame in the areas where the individual IC packages will be singulated from the frame and utilizes a laser to clean the etched areas and remove any mold compound or other contaminant from the surface of the etched areas. Etching is frequently done to reduce the amount of metal to be cut in a later sawing process, extending the life of the saw and thereby reducing manufacturing cost. The cleaned etched areas are plated at the same time that the underside of the connection bars are plated with a solder-wettable metal. The IC packages are then singulated by cutting along the center of the etched areas with a narrow saw that leaves a portion of the etched area as a bevel at the lower outside corner of the terminals that are formed from the cut connection bars.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

Figure 1A:
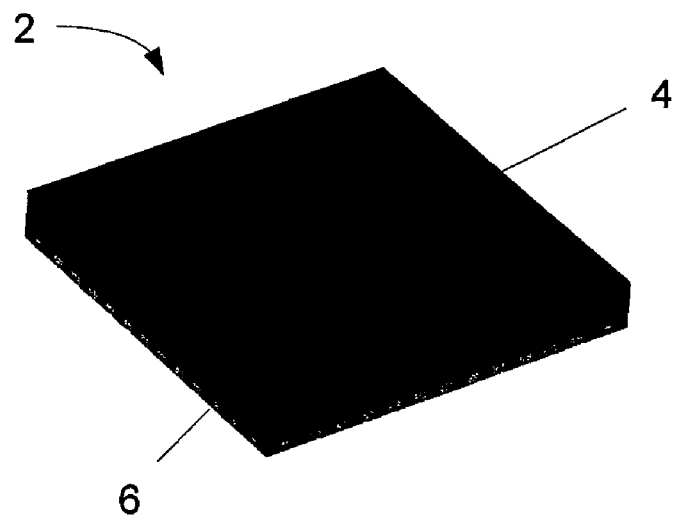
FIGS. 1A-1B are perspective views of a QFN IC package having terminals exposed on the bottom of the package body.
Figure 1B:
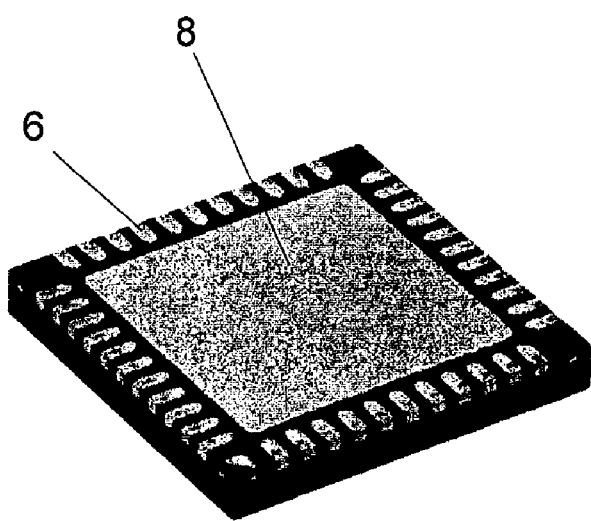

FIGS. 1A-1B are perspective views of a QFN IC package 2 having terminals 6 exposed on the bottom of the package body 4. In this example, IC package 2 has approximately 11 terminals along each of its four sides. Terminals 6 are placed directly over the mating connector pads on the PCB (not shown) to which the IC package 2 is soldered. FIG. 2B shows the underside of the IC package of FIG. 1A, wherein the die attach pad 8 can be seen to be exposed such that it can be thermally coupled to the PCB (not shown) to dissipate heat.

Figure 2A:
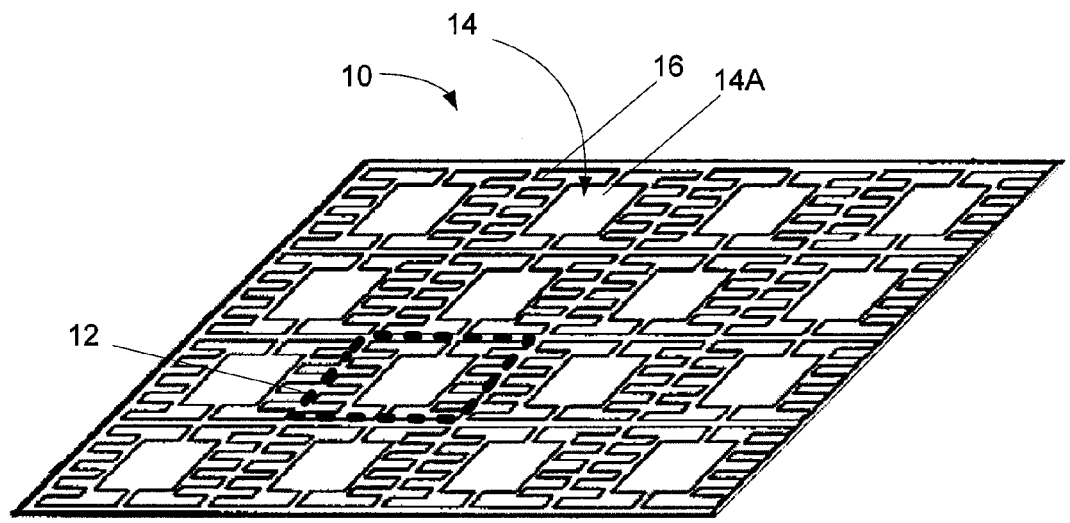
FIG. 2A is perspective view of a frame of leadframes.
Figure 2B:
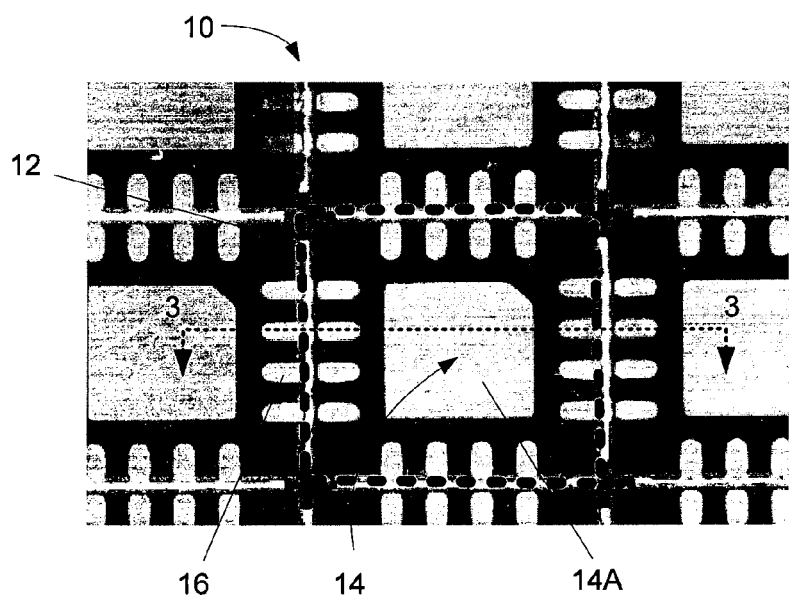
FIG. 2B is a plan view of a portion of a frame for a QFN device.

FIG. 2A is perspective view of a frame 10 of leadframes 14, wherein the portion of frame 10 associated with a leadframe 14 is indicated by the shade-line box 12. The leadframes 14 include die attach pads 14A and a set of associated leads that are all connected to each other and to adjacent units internally, forming connection bars 16, to keep them shorted together as well as provide mechanical integrity during processing. The individual leadframes 14 are then singulated by sawing through "streets" in between each unit along perimeter of the dashed-line box 12. This singulation process also defines the lengths of the lead terminals and the dimensions of the package outline.

In certain embodiments, leadframes 14 may not comprise a die attach pad 14A. In some embodiments, the IC die 20 of FIG. 3A may be attached to the bottom of leadframe 14 such as for a flipchip attached directly to the leads. In other embodiments, the IC die 20 may be attached on top of the leads such as for "chip on lead" or "flipchip on lead" IC packages. These and other variations of die attachment to a leadframe are known or will be obvious to those of skill in the art without departing from the scope of this disclosure.

FIG. 2B is a plan view of a portion of a frame 10 for a QFN device. The dashed-line box 12 indicates the extent of IC package 40 of FIG. 4B, including the die attach pad 14A and the connection bars 16 which cross the perimeter of the dashed-line box.

Figure 3A:
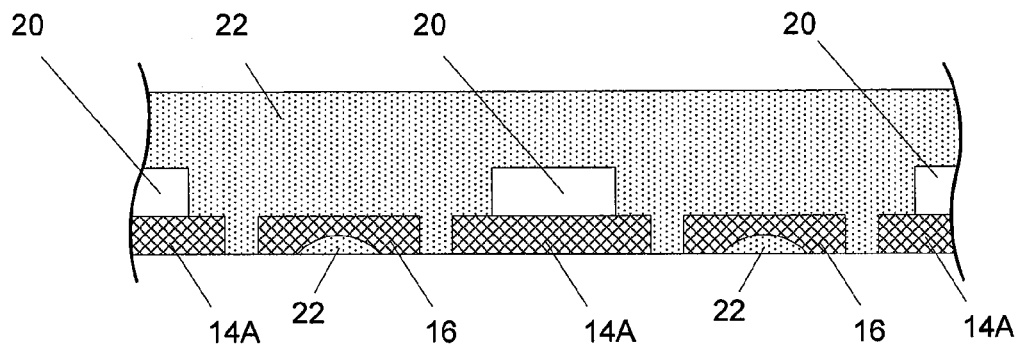
FIG. 3A is a cross-section of a portion of the frame of leadframes of FIG. 2 after dice have been attached to the die attach pads and the frame has been overmolded according to certain aspects of the present disclosure.

FIG. 3A is a cross-section of a portion of the frame 10 of leadframes 14 of FIG. 2 after dice 20 have been attached to the die attach pads 14A and the frame 10 has been overmolded according to certain aspects of the present disclosure. The cross-section has been taken along section 3-3 in FIG. 2. The overmolding process forms a panel of plastic mold compound 22 which completely coats an array of units that each include a die 20, die-to-die-attach-pad adhesive (not shown), die bond wires (not shown) and a die attach pad 14A. Since the surface of the terminals must be left exposed after mold, they are sealed from the mold compound with a tape (not shown) that covers the entire bottom side of the frame 10. The mold compound 22 flows into the etched areas under connection bars 16, as can be seen in FIG. 3A, while the underside of the remaining portion of the connection bars 16 and the underside of the die attach pad 14A remain clear of mold compound 22.

Figure 3B:
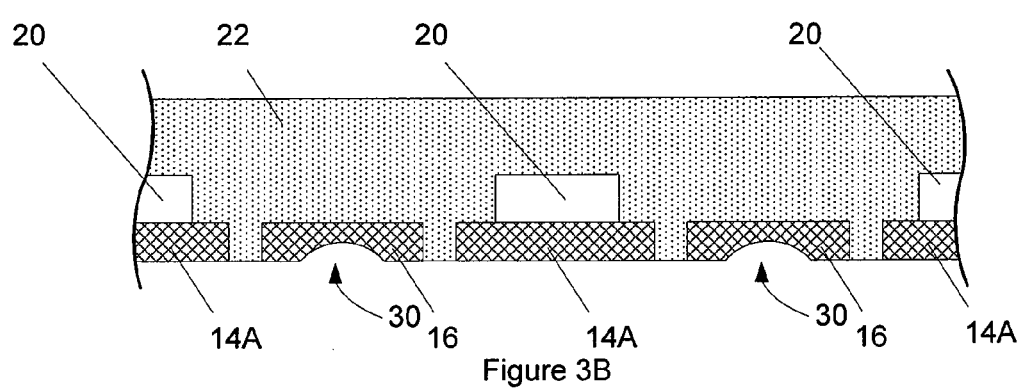
FIGS. 3B-3D depict the process steps of creating a beveled terminal according to certain aspects of the present disclosure.
Figure 3C:
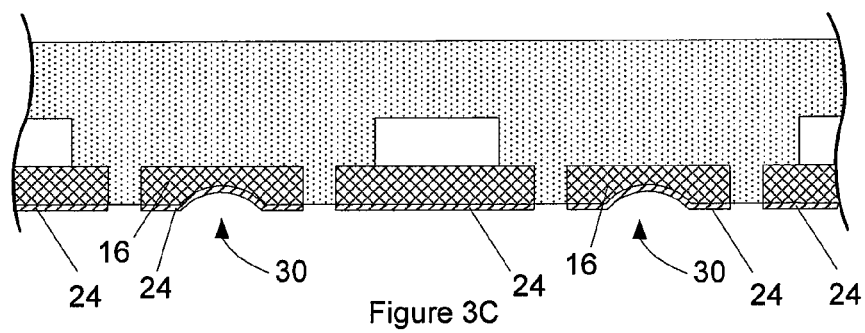
Figure 3D:
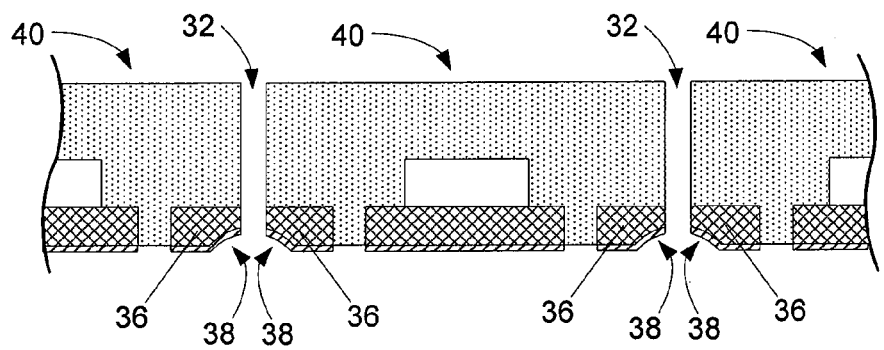

FIGS. 3B-3D depict the process steps of creating a beveled terminal 36 according to certain aspects of the present disclosure. In FIG. 3B, a laser beam, has been directed over the etched grooves 30, burning away the mold compound 22 that filled these grooves 30 in FIG. 3A. The laser that provided this laser beam may the same laser used for lasermarking the exterior plastic of the IC packages 40 or laser deflashing. Using a laser that is already part of the production line may reduce the tooling and equipment costs for implementation of this process. A laser having an output power of approximately 20 watts and a frequency absorbed by the mold compound 22 has been found to be sufficient to remove the mold compound 22 from the grooves 30.

In FIG. 3C, a coating 24 of a solder-wettable material has been applied to the exposed surfaces of the die attach pads 14A and the connection bars 16. In this example, this is a plated coating of a solderable metal such as tin. It can be seen that the coating 24 covers the grooves 30 as well as the flat surfaces.

FIG. 3D depicts the frame 10 after singulation cuts 32 have been made through centers of grooves 30 to separate IC packages 40. These cuts 32 are made along the dashed lines of the box around IC package 12 in FIG. 2B. The width of the singulation cuts 32 is less than the width of the grooves 30 such that a coated bevel 38, or notch, remains at the corner of the terminals 36 formed by cutting through the connection bars 16.

Figure 4A:
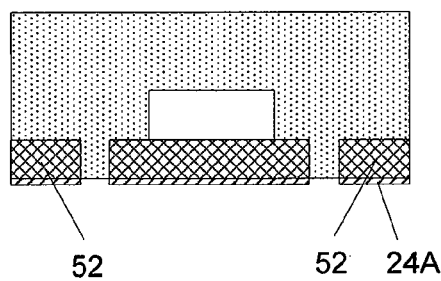
FIGS. 4A-4B show a comparison of an IC package having beveled terminals to an IC package with standard terminals according to certain aspects of the present disclosure.
Figure 4B:
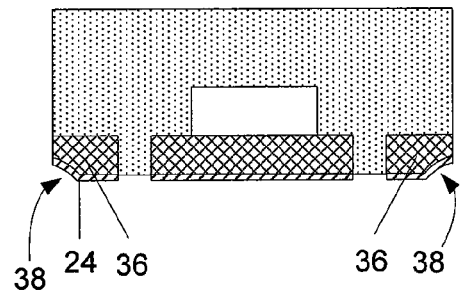

FIGS. 4A-4B show a comparison of an IC package 40 having beveled terminals 36 to an IC package 50 with standard terminals 52 according to certain aspects of the present disclosure. The coated bevels 38 of IC package 40 provide a vertical solderable surface on the side of terminals 36, whereas the terminals 52 of the standard IC package 50 have effectively no vertical solderable surface and therefore solder will not coat the sides of the terminals 52, making it impossible to inspect the solder joint visually.

Figure 5:
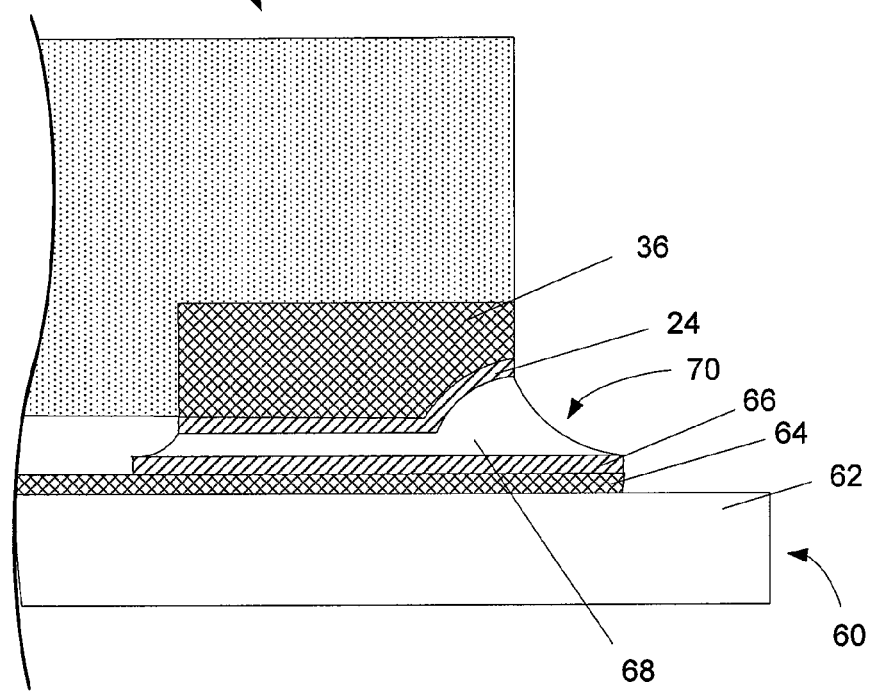
FIG. 5 illustrates a solder joint created by a beveled terminal after attachment to a PCB according to certain aspects of the present disclosure.

FIG. 5 illustrates a solder joint created by a beveled terminal 36 after attachment to a PCB 60 according to certain aspects of the present disclosure. PCB 60 includes a substrate 62, a conductive circuit trace 64 comprised of a conductive metal such as copper, and a solder pad 66 that is formed from an area of trace 64 that is coated with a solder-wettable material. In this example, contact pad 66 is formed from tin. When the solder 68 is molten, it wets the entire surfaces 24 and 66, forming a meniscus 70 at the outer edge where the contact pad 66 protrudes past the perimeter of IC package 40. This meniscus 70 can be visually inspected to verify that the solder joint is properly formed, eliminating the need to X-ray the joint to perform this inspection.

Figure 6:
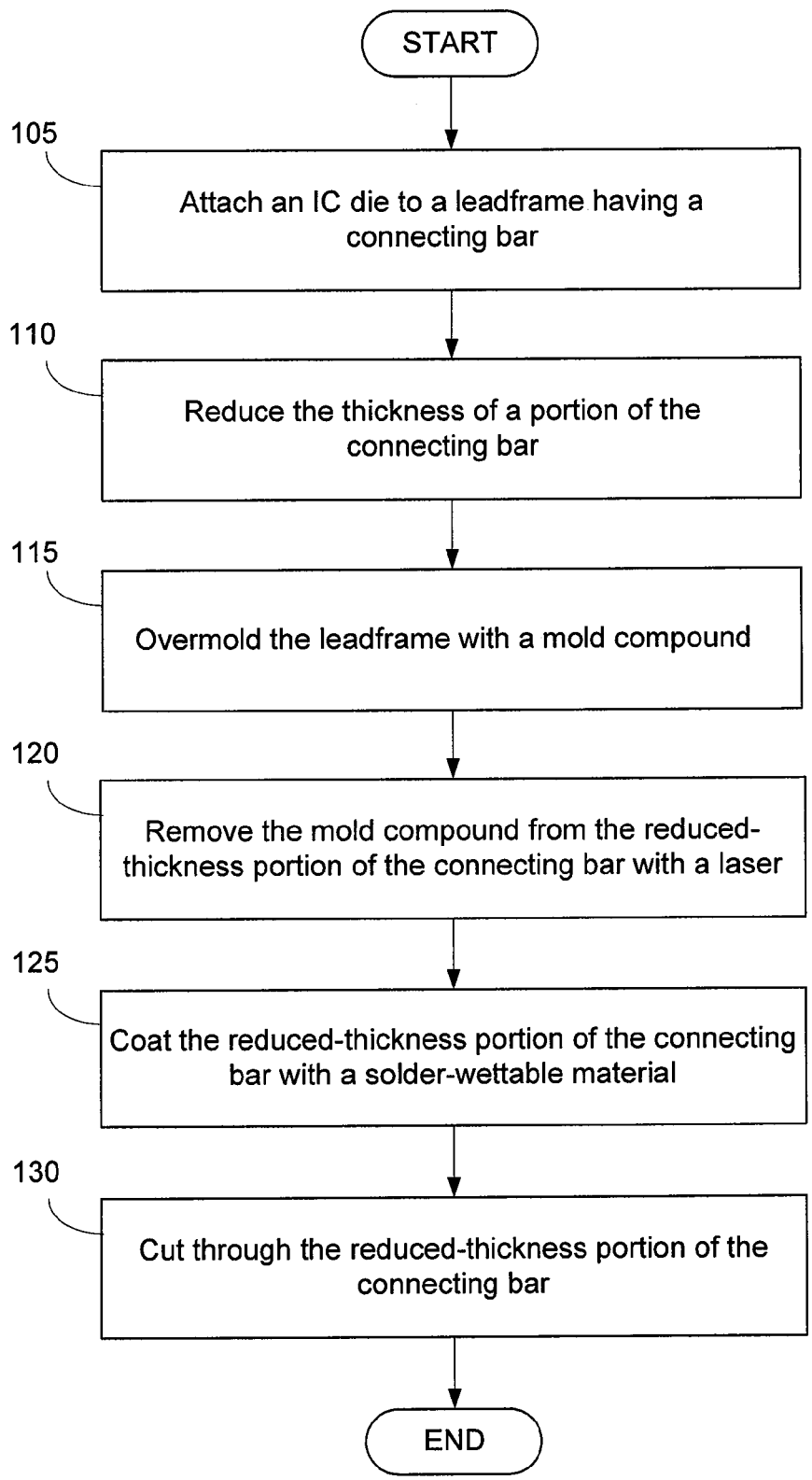
FIG. 6 is a flowchart illustrating the process of forming a beveled terminal according to certain aspects of the present disclosure.

FIG. 6 is a flowchart illustrating the process of forming a beveled terminal 36 according to certain aspects of the present disclosure. In step 105, an IC die 20 is attached to a leadframe 14 having a connecting bar 16. In some embodiments, a plurality of leadframes 14 are formed as a frame 10 wherein the connecting bars 16 interconnect the leadframes 14. Step 105 may also comprise attachment of bond wires from the IC die 20 to the connecting bars 16 that will form the leads of the IC package 40. In step 110, the thickness of the connecting bars 16 is reduced over a portion of the connecting bar 16. This step 110 may be performed by selective etching of the leadframe 14 or frame 10, and may be performed before step 105. Methods of selectively and partially etching leadframes are well known to those of ordinary skill in the art. In step 115, the leadframe 14 or frame 10 are overmolded with a mold compound 22. In some embodiments, a plurality of leadframes 14 are formed into a strip wherein a section of the strip is overmolded to form a panel containing a plurality of leadframes 14. In some embodiments, a tape is applied to the bottom surface of the leadframe to mask certain surfaces such that the surfaces are not coated with mold compound 22. In step 120, the mold compound 22 is removed from the regions of reduced-thickness of the connecting bars 16 by a laser. In some embodiments, the laser may remove mold compound 22 as well as remove a portion of the connecting bar 16 at the same time. After the surface of the reduced-thickness portion of the connecting bar 16 is cleaned by the laser, the exposed area of the connecting bar, both the reduced-thickness section and the remaining section, are coated with a solder-wettable material. In some embodiments, this material is applied by plating and may be a metal such as tin. In some embodiments, all exposed areas of leadframe 14 are coated. In step 130, cuts 32 are made through the reduced-thickness sections of the connecting bars 16. In some embodiments, these cuts 32 are thinner than the width of the reduced-thickness section. In embodiments where a plurality of leadframes 14 have been formed into a frame 10 and overmolded into a panel, the cuts 32 singulate the IC packages 40.

It can be seen that the disclosed embodiments of the method of forming a bevel at the outer edge of the terminals of an IC package such as a DFN or QFN package provide the ability to inspect the quality of solder joints attaching the IC package to a PCB without the use of X-rays. The use of a laser to remove the mold compound, where the laser may already be installed on the line to laser-etch markings onto the IC package, avoids the need to make an additional saw cut. A reduction in inspection and/or a reduction in the cost of sawing may reduce the cost and complexity of the production of the IC packages.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of preparing a portion of the side of a terminal of an Integrated Circuit (IC) package for solder, the method comprising the steps of:
    attaching an IC die to a leadframe comprising a connecting bar having a thickness;
    reducing the thickness of a portion of the connecting bar, the reduced-thickness portion having a width;
    overmolding the leadframe with a mold compound;
    removing the mold compound from the reduced-thickness portion of the connecting bar using a laser;
    coating the reduced-thickness portion of the connecting bar with a solder-wettable material; and
    cutting through the thickness of the connecting bar within the reduced-thickness portion of the connecting bar, wherein the cut has a width that is less than the width of the reduced-thickness portion of the connecting bar.

2. The method of claim 1, wherein the step of reducing the thickness of a portion of the connecting bar comprises etching the connecting bar.

3. The method of claim 1, wherein the leadframe and connecting bar have a bottom surface, and wherein the step of overmolding the leadframe comprises applying a tape to the bottom surface of the leadframe and connecting bar.

4. The method of claim 1, wherein the step of coating the reduced-thickness portion of the connecting bar comprises plating a metal onto the connecting bar.

5. The method of claim 1, wherein the saw cut is centered in the reduced-thickness portion of the connecting bar.

6. The method of claim 1, wherein the step of cutting through the thickness of the connecting bar comprises sawing through the full thickness of the mold compound.

7. The method of claim 1, wherein:
    the leadframe has a top and a bottom on the side opposite to the top;
    the connecting bar has a top and a bottom on the side opposite to the top;
    the bottom of the connecting bar is coplanar with a bottom plane;

the step of reducing the thickness of a portion of the connecting bar comprises removing material from the bottom of the connecting bar;

the step of overmolding the leadframe with a mold compound comprises applying the mold compound to the top of the leadframe and forming a monolithic layer having a bottom that lies in the bottom plane with the portion of the connecting bar where material has not been removed remaining exposed.

8. The method of claim 1, wherein:

the IC die has a first surface and a second surface opposite the first surface;

the step of attaching an IC die to a leadframe comprises attaching the first surface of the IC to the leadframe;

the leadframe is configured such that either a portion of the leadframe or the second surface of the IC are coplanar with the bottom plane; and the step of overmolding the leadframe with a mold compound comprises either the leadframe or the second surface of the IC remaining exposed.

9. The method of claim 1, wherein the step of attaching an IC die to a leadframe comprises attaching a plurality of IC dice to a leadframe strip having a plurality of die attach locations and at least one connecting bar associated with each die attach location.

10. The method of claim 9, wherein the step of overmolding the leadframe with a mold compound comprises overmolding a portion of the leadframe strip to form a panel.

11. The method of claim 10, wherein the leadframe strip has a bottom surface, and wherein the step of overmolding the leadframe strip with a mold compound comprises application of a tape to the bottom surface of the leadframe strip.

12. The method of claim 11, wherein the step of cutting through the thickness of the connecting bar comprises singulating the frame into individual IC devices by cutting through the connecting bars between die attach locations, the individual IC devices having sides adjoining the bottom surface, wherein at least one connecting bar is exposed on at least one side.

13. A method of creating a visually-inspectable terminal, the method comprising the steps of:

etching a connecting bar of a leadframe, wherein the connecting bar has an underside and the etching removes material from the underside over a portion of the connecting bar, the etched portion having a width;

lasering the etched portion of the connecting bar with sufficient energy and duration to remove material from the etched portion;

coating the etched portion of the connecting bar with a solder-wettable material; and cutting through the etched portion of the connecting bar, wherein the cut has a width that is less than the width of the etched portion.

14. The method of claim 13, wherein the step of cutting through the etched portion of the connecting bar comprises singulating a IC package from a frame comprised of a plurality of leadframes, wherein the connecting bars are connected between leadframes in the frame.

15. The method of claim 13, wherein the step of coating the etched portion comprises plating a solder-wettable metal onto the connecting bar.

16. The method of claim 13, wherein the material removed in the step of lasering the etched portion comprises mold compound.

17. The method of claim 13, wherein the step of cutting through the etched portion comprises sawing.

18. The method of claim 13, further comprising the step of overmolding the leadframe with a mold compound.

\* \* \* \* \*